United States Patent
Asano et al.

(10) Patent No.: US 6,737,865 B2
(45) Date of Patent: May 18, 2004

(54) MRI APPARATUS

(75) Inventors: Kenji Asano, Tokyo (JP); Susumu Kosugi, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/370,253

(22) Filed: Feb. 20, 2003

(65) Prior Publication Data
US 2003/0160616 A1 Aug. 28, 2003

(30) Foreign Application Priority Data
Feb. 22, 2002 (JP) ........................ 2002-046828

(51) Int. Cl.[7] ................................. G01V 3/00
(52) U.S. Cl. ..................... 324/307; 324/309
(58) Field of Search ................. 324/309, 307, 324/312, 300; 600/410; 128/653.1

(56) References Cited

U.S. PATENT DOCUMENTS

| | | | |
|---|---|---|---|
| 5,497,088 A | 3/1996 | Hayano et al. | 324/309 |
| 5,729,139 A | 3/1998 | Goto | 324/209 |
| 6,054,853 A | 4/2000 | Miyamoto et al. | 324/309 |
| 6,127,825 A | 10/2000 | Goto | 324/307 |
| 6,218,834 B1 | 4/2001 | Goto | 324/307 |
| 6,289,232 B1 * | 9/2001 | Jakob et al. | 600/410 |
| 6,359,436 B1 | 3/2002 | Miyamoto et al. | 324/307 |
| 6,388,442 B1 | 5/2002 | Uetake et al. | 324/309 |
| 6,407,549 B1 | 6/2002 | Uetake et al. | 324/307 |
| 6,456,073 B2 | 9/2002 | Uetake et al. | 324/309 |
| 6,472,872 B1 | 10/2002 | Jack, Jr. et al. | 324/307 |
| 6,479,995 B1 | 11/2002 | Ogino | 324/309 |

\* cited by examiner

Primary Examiner—Brij B. Shrivastav
(74) Attorney, Agent, or Firm—Carl B. Horton, Esq.; Armstrong Teasdale LLP

(57) ABSTRACT

For the purpose of thoroughly reducing the effect of residual magnetization caused by gradient pulses, the strength of a phase rewinding gradient is made half or about half of that of a phase encoding gradient; the strength of a slice rewinding gradient is made half or about half of that of a slice encoding gradient; a killer gradient having an intensity equal to that of the slice selective gradient is applied to the slice axis; and a killer gradient having an intensity equal to that of a readout gradient is applied to the frequency axis subsequent to the readout gradient.

6 Claims, 8 Drawing Sheets

MRI apparatus 100

Static Magnetic Field Inhomogeneity Distribution Measuring Sequence SQJ

MRI APPARATUS

CROSS REFERENCE TO RELATED APPLICATIONS

This application claims the benefit of Japanese Application No. 2002-046828 filed Feb. 22, 2002.

BACKGROUND OF THE INVENTION

The present invention relates to a static magnetic field inhomogeneity distribution measuring method, static magnetic field homogenizing method, MR (magnetic resonance) data collecting method, and MRI (magnetic resonance imaging) apparatus, and more particularly to a static magnetic field inhomogeneity measuring method, static magnetic field homogenizing method, MR data collecting method, and MRI apparatus by which the effect of residual magnetization caused by gradient pulses can be thoroughly reduced.

A known static magnetic field inhomogeneity distribution measuring sequence SQJ is shown in FIG. 7.

The static magnetic field inhomogeneity distribution measuring sequence SQJ applies an RF pulse P1 and a slice selective gradient Ss1; subsequently applies a slice rephasing gradient Sr1' having an intensity (amplitude) equal to that of the slice selective gradient Ss1; applies a phase encoding gradient Pe1; applies a frequency dephasing gradient Fd1' having an intensity equal to that of a readout gradient Ro1; subsequently collects first MR data while applying the readout gradient Ro1; then, applies a phase rewinding gradient Pr1' having an intensity equal to that of the phase encoding gradient Pe1; and further applies a killer gradient Sk1' having an intensity greater than that of the slice selective gradient. Subsequent to the first gradient echo sequence, a second gradient echo sequence in which the echo time is shifted by $\delta t$ collects second MR data. Then, the distribution of static magnetic field inhomogeneity is measured based on the phase difference between the first and second MR data.

Moreover, Japanese Patent Application Laid Open No. 2001-54510 discloses means for suppressing variation of residual magnetization in a magnetization conditioning plate, for example, in an MRI apparatus, which variation depends upon the history of gradient pulse application, in which means:

(1) a residual magnetization reducing pulse is applied immediately after the phase encoding gradient;

(2) a residual magnetization reducing pulse is applied immediately after the phase rewinding gradient;

(3) a residual magnetization reducing pulse is applied immediately after the killer gradient;

(4) the intensity (amplitude) of the slice rephasing gradient is made about half of that of the slice selective gradient; and (5) the intensity of the frequency dephasing gradient is adjusted.

FIG. 8 is a magnetization characteristic graph for explaining the effect of residual magnetization caused by the gradient pulses in the static magnetic field inhomogeneity distribution measuring sequence SQJ shown in FIG. 7. It should be noted that the graph is presented merely for explanation of a concept, and does not limit the present invention.

Considering first only the effect of the gradient pulses applied to the slice axis in general, when the magnetization lies at a point a of a magnetization B0 corresponding to a static magnetic field strength H0, application of the slice selective gradient Ss1 and slice rephasing gradient Sr1' by the first gradient echo sequence causes the magnetization to move from the point a, through points b, c and e, to a point f. Then, when the killer gradient Sk1' is applied, the magnetization moves from the point f through the point b, enters a major loop, and travels through a point B' to a point c'. In the second gradient echo sequence, the magnetization varies along another minor loop containing the point c'.

Considering next only the effect of the gradient pulses applied to the phase axis in general, when the magnetization lies at the point a of a magnetization B0 corresponding to a static magnetic field strength H0, application of the phase encoding gradient Pe1 by the first gradient echo sequence causes the magnetization to move from the point a through the point b to the point c, and then application of the phase rewinding gradient Pr1' causes the magnetization to move from the point c through the point e to the point f. Next, when the phase encoding gradient Pe2 is applied by the second gradient echo sequence, the magnetization moves from the point f through the point b to the point c, and when the phase rewinding gradient Pr2' is then applied, the magnetization moves from the point c through the point e to the point f.

Next, considering only the effect of the gradient pulses applied to the frequency axis, when the magnetization lies at the point a of a magnetization B0 corresponding to a static magnetic field strength H0, application of the frequency dephasing gradient Fd1' and readout gradient Ro1 by the first gradient echo sequence causes the magnetization to move from the point a, through the points e, f, and b, to the point c. The magnetization varies in a similar manner in the second gradient echo sequence.

As described above, the conventional static magnetic field inhomogeneity distribution measuring sequence SQJ poses a problem in that the distribution of static magnetic field inhomogeneity cannot be accurately measured because magnetization varies due to gradient pulses.

Consequently, correct shimming cannot be achieved, and the image quality may be significantly degraded especially when conducting an imaging method utilizing the resonance frequency difference between water and fat, such as a CHESS (chemical shift selective imaging) method, in an MRI apparatus with a medium-to-low magnetic field (0.3–0.5 T).

To solve the problem, the inventors of the present invention studied use of means disclosed in Japanese Patent Application Laid Open No. 2001-54510, but the distribution of static magnetic field inhomogeneity cannot be highly accurately measured only by this means. Further investigation was therefore made to find new means for suppressing variation of residual magnetization that depends upon the history of gradient pulse application, and completed the present invention.

SUMMARY OF THE INVENTION

An object of the present invention is to provide a static magnetic field inhomogeneity measuring method, static magnetic field homogenizing method, MR data collecting method, and MRI apparatus by which the effect of residual magnetization caused by gradient pulses can be thoroughly reduced.

In accordance with its first aspect, the present invention provides a static magnetic field inhomogeneity distribution measuring method characterized in comprising: collecting first MR data from an echo focused by a first gradient echo sequence in which the intensity of a killer gradient applied to a slice axis is made equal to that of a slice selective gradient, the intensity of a slice rephasing gradient is made half or about half of that of the slice selective gradient, the intensity of a phase rewinding gradient is made half or about half of that of a phase encoding gradient, and the intensity of a frequency dephasing gradient is made double or about double of that of a readout gradient; collecting second MR data from an echo focused by a second gradient echo sequence in which the echo time is shifted by δt relative to said first gradient echo sequence; and measuring the distribution of static magnetic field inhomogeneity based on the phase difference between said MR data.

Conventionally, the intensity of the killer gradient applied to the slice axis is greater than that of the slice selective gradient. Therefore, the variation of residual magnetization due to the killer gradient is large. Thus, Japanese Patent Application Laid Open No. 2001-54510 described above proposes application of a residual magnetization reducing pulse immediately after the killer gradient.

In contrast, the intensity of the killer gradient applied to the slice axis is made equal to that of the slice selective gradient in the static magnetic field inhomogeneity distribution measuring method of the first aspect. Therefore, the variation of residual magnetization by the killer gradient is limited within variation of residual magnetization by a slice selective gradient applied after the killer gradient, and such variation can be sufficiently dealt with by means for suppressing variation of residual magnetization by a slice selective gradient, which will be described next. Thus, the need to apply the residual magnetization reducing pulse immediately after the killer gradient is eliminated.

Moreover, in the static magnetic field inhomogeneity distribution measuring method of the first aspect, the intensity of the slice rephasing gradient is made half or about half of that of the slice selective gradient. Thus, the variation of residual magnetization due to the slice selective gradient is suppressed, as disclosed in Japanese Patent Application Laid Open No. 2001-54510.

That is, the effect of residual magnetization by gradient pulses applied to the slice axis is reduced.

Next, for the phase axis, Japanese Patent Application Laid Open No. 2001-54510 described above proposes application of a residual magnetization reducing pulse immediately after the phase encoding gradient.

In contrast, the intensity of the phase rewinding gradient is made half or about half of that of the phase encoding gradient in the static magnetic field inhomogeneity distribution measuring method of the first aspect. Thus, the effect of residual magnetization by gradient pulses applied to the phase axis is reduced, as will be described below with reference to FIG. 3.

Next, for the frequency axis, the intensity of the frequency dephasing gradient is made double or about double of that of the readout gradient. Thus, the effect of residual magnetization by gradient pulses applied to the frequency axis is reduced, as disclosed in Japanese Patent Application Laid Open No. 2001-54510.

Ultimately, since the effects of residual magnetization by gradient pulses applied to all the gradient axes are reduced in the static magnetic field inhomogeneity distribution measuring method of the first aspect, the distribution of static magnetic field inhomogeneity can be highly accurately measured.

In accordance with its second aspect, the present invention provides a static magnetic field inhomogeneity distribution measuring method characterized in comprising: collecting first MR data from an echo focused by a first gradient echo sequence in which the intensity of a slice rephasing gradient is made half or about half of that of a slice selective gradient, the intensity of a slice rewinding gradient is made half or about half of that of a slice encoding gradient, the intensity of a phase rewinding gradient is made half or about half of that of a phase encoding gradient, the intensity of a frequency dephasing gradient is made double or about double of that of a readout gradient, and the intensity of a killer gradient applied to a frequency axis is made equal to that of the readout gradient and the killer gradient is applied subsequent to the readout gradient; collecting second MR data from an echo focused by a second gradient echo sequence in which the echo time is shifted by δt relative to said first gradient echo sequence; and measuring the distribution of static magnetic field inhomogeneity based on the phase difference between said MR data.

In the static magnetic field inhomogeneity distribution measuring method of the second aspect, a slice rewinding gradient is applied which has an intensity half of or about half of that of the slice encoding gradient applied for 3D imaging. Thus, the effect of residual magnetization by the slice encoding and rewinding gradients is reduced, as will be described later with reference to FIG. 3. Moreover, a killer gradient applied to the frequency axis has an intensity equal to that of the readout gradient and the killer gradient is applied subsequent to the readout gradient. Therefore, variation of residual magnetization by the killer gradient can be regarded as being merged with residual magnetization by the readout gradient. Since the intensity of the frequency dephasing gradient is made double or about double of that of the readout gradient, the effect of residual magnetization by gradient pulses applied to the frequency axis is reduced, as disclosed in Japanese Patent Application Laid Open No. 2001-54510. Other features are similar to those of the static magnetic field inhomogeneity distribution measuring method of the first aspect.

Ultimately, since the effects of residual magnetization by gradient pulses applied to all the gradient axes are reduced also in 3D imaging in the static magnetic field inhomogeneity distribution measuring method of the second aspect, the distribution of static magnetic field inhomogeneity can be highly accurately measured.

In accordance with its third aspect, the present invention provides a static magnetic field inhomogeneity distribution measuring method characterized in comprising: collecting first MR data from an echo focused by a first gradient echo sequence in which the intensity of a slice rephasing gradient is made half or about half of that of a slice selective gradient, the intensity of a phase rewinding gradient is made half or about half of that of a phase encoding gradient, the intensity of a frequency dephasing gradient is made double or about double of that of a readout gradient, and the intensity of a killer gradient applied to a frequency axis is made equal to that of the readout gradient and the killer gradient is applied subsequent to the readout gradient; collecting second MR data from an echo focused by a second gradient echo sequence in which the echo time is shifted by δt relative to said first gradient echo sequence; and measuring the distribution of static magnetic field inhomogeneity based on the phase difference between said MR data.

In the static magnetic field inhomogeneity distribution measuring method of the third aspect, a killer gradient applied to the frequency axis has an intensity equal to that of the readout gradient and the killer gradient is applied subsequent to the readout gradient. Therefore, variation of residual magnetization by the killer gradient can be regarded as being merged with residual magnetization by the readout gradient. Since the intensity of the frequency dephasing gradient is made double or about double of that of the readout gradient, the effect of residual magnetization by gradient pulses applied to the frequency axis is reduced, as disclosed in Japanese Patent Application Laid Open No. 2001-54510. Other features are similar to those of the static magnetic field inhomogeneity distribution measuring method of the first aspect.

Ultimately, since the effects of residual magnetization by gradient pulses applied to all the gradient axes are reduced in the static magnetic field inhomogeneity distribution measuring method of the third aspect, the distribution of static magnetic field inhomogeneity can be highly accurately measured.

In accordance with its fourth aspect, the present invention provides a static magnetic field homogenizing method characterized in comprising: collecting MR data for conducting shimming by the static magnetic field inhomogeneity distribution measuring method having the aforementioned configuration.

In the static magnetic field inhomogeneity distribution measuring method of the fourth aspect, since MR data is highly accurately measured, correct shimming can be conducted, and the image quality is improved especially when conducting an imaging method utilizing the resonance frequency difference between water and fat, such as the CHESS method, in an MRI apparatus with a medium-to-low magnetic field.

In accordance with its fifth aspect, the present invention provides an MR data collecting method characterized in that: the intensity of a phase rewinding gradient is made half or about half of that of a phase encoding gradient.

In the MR data collecting method of the fifth aspect, the intensity of the phase rewinding gradient is made half or about half of that of the phase encoding gradient. Thus, the effect of residual magnetization by gradient pulses applied to the phase axis is reduced, as will be described later with reference to FIG. 3.

In accordance with its sixth aspect, the present invention provides an MR data collecting method characterized in that: the intensity of a slice rewinding gradient is made half or about half of that of a slice encoding gradient.

In the MR data collecting method of the sixth aspect, a slice rewinding gradient having an intensity half or about half of that of a slice encoding gradient applied for 3D imaging is applied. Thus, the effect of residual magnetization by the slice encoding gradient and slice rewinding gradient is reduced, as will be described later with reference to FIG. 3.

In accordance with its seventh aspect, the present invention provides an MR data collecting method characterized in comprising: applying a killer gradient having an intensity equal to that of a slice selective gradient to a slice axis.

In the MR collecting method of the seventh aspect, the intensity of the killer gradient applied to the slice axis is made equal to that of the slice selective gradient. Therefore, variation of residual magnetization by the killer gradient is limited within variation of residual magnetization by the slice selective gradient applied after the killer gradient, and no special measure for dealing with the variation of residual magnetization caused by the killer gradient is needed.

In accordance with its eighth aspect, the present invention provides an MR data collecting method characterized in comprising: applying a killer gradient having an intensity equal to that of a readout gradient to a frequency axis subsequent to the readout gradient.

In the MR data collecting method of the eighth aspect, a killer gradient applied to the frequency axis has an intensity equal to that of the readout gradient and the killer gradient is applied subsequent to the readout gradient. Therefore, since variation of residual magnetization by the killer gradient can be regarded as being merged with residual magnetization by the readout gradient, no special measure for dealing with the variation of residual magnetization caused by the killer gradient is needed.

In accordance with its ninth aspect, the present invention provides an MRI apparatus characterized in comprising: RF pulse transmitting means; gradient pulse applying means; MR signal receiving means; first MR data collecting means for, by controlling the aforesaid means, collecting first MR data from an echo focused by a first gradient echo sequence in which the intensity of a killer gradient applied to a slice axis is made equal to that of a slice selective gradient, the intensity of a slice rephasing gradient is made half or about half of that of the slice selective gradient, the intensity of a phase rewinding gradient is made half or about half of that of a phase encoding gradient, and the intensity of a frequency dephasing gradient is made double or about double of that of a readout gradient; and second MR data collecting means for collecting second MR data from an echo focused by a second gradient echo sequence in which the echo time is shifted by $\delta t$ relative to said first gradient echo sequence.

In the MRI apparatus of the ninth aspect, the static magnetic field inhomogeneity distribution measuring method of the first aspect can be suitably implemented.

In accordance with its tenth aspect, the present invention provides an MRI apparatus characterized in comprising: RF pulse transmitting means; gradient pulse applying means; MR signal receiving means; first MR data collecting means for, by controlling the aforesaid means, collecting first MR data from an echo focused by a first gradient echo sequence in which the intensity of a slice rephasing gradient is made half or about half of that of a slice selective gradient, the intensity of a slice rewinding gradient is made half or about half of that of a slice encoding gradient, the intensity of a phase rewinding gradient is made half or about half of that of a phase encoding gradient, the intensity of a frequency dephasing gradient is made double or about double of that of a readout gradient, and the intensity of a killer gradient applied to a frequency axis is made equal to that of the readout gradient and the killer gradient is applied subsequent to the readout gradient; and second MR data collecting means for collecting second MR data from an echo focused by a second gradient echo sequence in which the echo time is shifted by $\delta t$ relative to said first gradient echo sequence.

In the MRI apparatus of the tenth aspect, the static magnetic field inhomogeneity distribution measuring method of the second aspect can be suitably implemented.

In accordance with its eleventh aspect, the present invention provides an MRI apparatus characterized in comprising: RF pulse transmitting means; gradient pulse applying means; MR signal receiving means; first MR data collecting means for, by controlling the aforesaid means, collecting first MR data from an echo focused by a first gradient echo sequence in which the intensity of a slice rephasing gradient is made half or about half of that of a slice selective gradient, the intensity of a phase rewinding gradient is made half or about half of that of a phase encoding gradient, the intensity of a frequency dephasing gradient is made double or about double of that of a readout gradient, and the intensity of a killer gradient applied to a frequency axis is made equal to that of the readout gradient and the killer gradient is applied subsequent to the readout gradient; and second MR data collecting means for collecting second MR data from an echo focused by a second gradient echo sequence in which the echo time is shifted by δt relative to said first gradient echo sequence.

In the MRI apparatus of the eleventh aspect, the static magnetic field inhomogeneity distribution measuring method of the third aspect can be suitably implemented.

In accordance with its twelfth aspect, the present invention provides the MRI apparatus having the aforementioned configuration, characterized in further comprising: static magnetic field inhomogeneity distribution measuring means for measuring the distribution of static magnetic field inhomogeneity based on the phase difference between said first and second MR data.

In the MRI apparatus of the twelfth aspect, the static magnetic field inhomogeneity distribution measuring method of the first—third aspects can be suitably implemented.

In accordance with its thirteenth aspect, the present invention provides an MRI apparatus comprising RF pulse transmitting means, gradient pulse applying means, and MR signal receiving means, characterized in that: said gradient pulse applying means makes the intensity of a phase rewinding gradient half or about half of that of a phase encoding gradient.

In the MRI apparatus of the thirteenth aspect, the MR data collecting method of the fifth aspect can be suitably implemented.

In accordance with its fourteenth aspect, the present invention provides an MRI apparatus comprising RF pulse transmitting means, gradient pulse applying means, and MR signal receiving means, characterized in that: said gradient pulse applying means makes the intensity of a slice rewinding gradient half or about half of that of a slice encoding gradient.

In the MRI apparatus of the fourteenth aspect, the MR data collecting method of the sixth aspect can be suitably implemented.

In accordance with its fifteenth aspect, the present invention provides an MRI apparatus comprising RF pulse transmitting means, gradient pulse applying means, and MR signal receiving means, characterized in that: said gradient pulse applying means applies a killer gradient having an intensity equal to that of a slice selective gradient to a slice axis.

In the MRI apparatus of the fifteenth aspect, the MR data collecting method of the seventh aspect can be suitably implemented.

In accordance with its sixteenth aspect, the present invention provides an MRI apparatus comprising RF pulse transmitting means, gradient pulse applying means, and MR signal receiving means, characterized in that: said gradient pulse applying means applies a killer gradient having an intensity equal to that of a readout gradient to a frequency axis subsequent to the readout gradient.

In the MRI apparatus of the sixteenth aspect, the MR data collecting method of the eighth aspect can be suitably implemented.

According to the static magnetic field inhomogeneity distribution measuring method, static magnetic field homogenizing method, MR data collecting method, and MRI apparatus of the present invention, the effect of residual magnetization caused by gradient pulses can be thoroughly reduced. As a result, correct shimming can be conducted, and the image quality is improved especially when conducting an imaging method utilizing the resonance frequency difference between water and fat, such as the CHESS method, in an MRI apparatus with a medium-to-low magnetic field.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to embodiments shown in the accompanying drawings. It should be noted that the present invention is not limited to these embodiments.

—First Embodiment—

Figure 1:
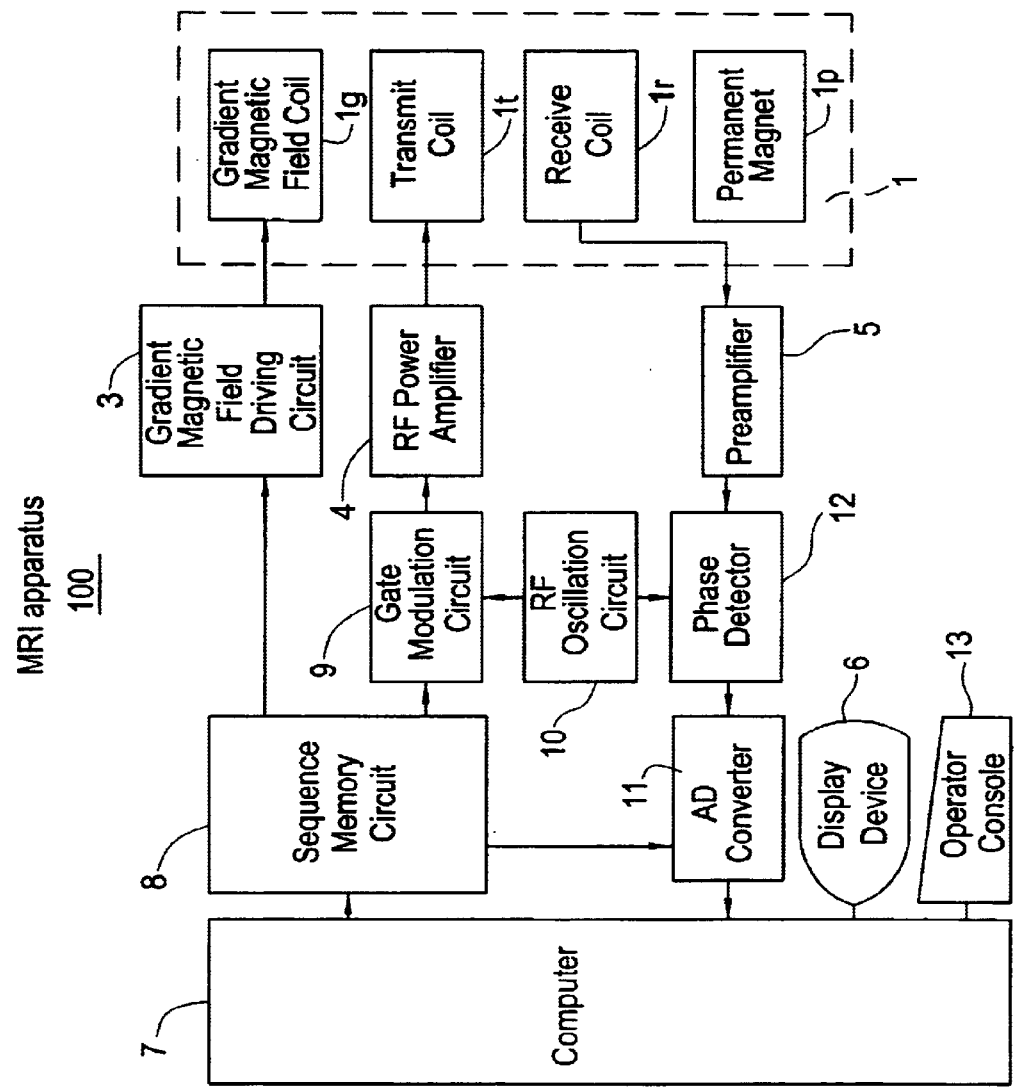
FIG. 1 is a block diagram showing an MRI apparatus in accordance with a first embodiment.

FIG. 1 is a block diagram showing an MRI apparatus in accordance with a first embodiment of the present invention.

In the MRI apparatus 100, a magnet assembly 1 has a cavity portion (bore) for inserting therein a subject, and is provided with a permanent magnet 1p for applying a static magnetic field having a constant strength H0 to the subject, a gradient magnetic field coil 1g for applying gradient pulses to a slice axis, phase axis and frequency axis, a transmit coil 1t for supplying RF pulses for exciting spins of atomic nuclei within the subject, and a receive coil 1r for detecting MR signals from the subject, these components being disposed surrounding the cavity portion.

The gradient magnetic field coil 1g, transmit coil 1t, and receive coil 1r are connected to a gradient magnetic field driving circuit 3, an RF power amplifier 4, and a preamplifier 5, respectively.

It should be noted that a super- or normal-conductive magnet may be employed in place of the permanent magnet type magnet 1p.

A sequence memory circuit 8 operates the gradient magnetic field driving circuit 3 based on a stored pulse sequence in response to instructions from a computer 7 to thereby apply gradient pulses from the gradient magnetic field coil 1g in the magnet assembly 1. The sequence memory circuit 8 also operates a gate modulation circuit 9 to modulate a carrier output signal from an RF oscillation circuit 10 into a pulsed signal of predefined timing and envelope shape. The pulsed signal is applied to the RF power amplifier 4 as an RF pulse, power-amplified in the RF power amplifier 4, and then applied to the transmit coil 1t in the magnet assembly 1 to selectively excite a desired slice region.

The preamplifier 5 amplifies the MR signals from the subject detected at the receive coil 1r in the magnet assembly 1, and inputs the signal to a phase detector 12. The phase detector 12 phase-detects the MR signals from the preamplifier 5 employing the carrier output signal from the RF oscillation circuit 10 as a reference signal, and supplies the phase-detected signal to an A/D converter 11. The A/D converter 11 converts the phase-detected analog signal into a digital signal, and inputs it to the computer 7.

The computer 7 reads the data from the A/D converter 11, and performs image reconstruction calculation to produce an image of the desired slice region. The image is displayed on a display device 6. The computer 7 is also responsible for overall control such as receiving information supplied from an operator console 12.

Figure 2:
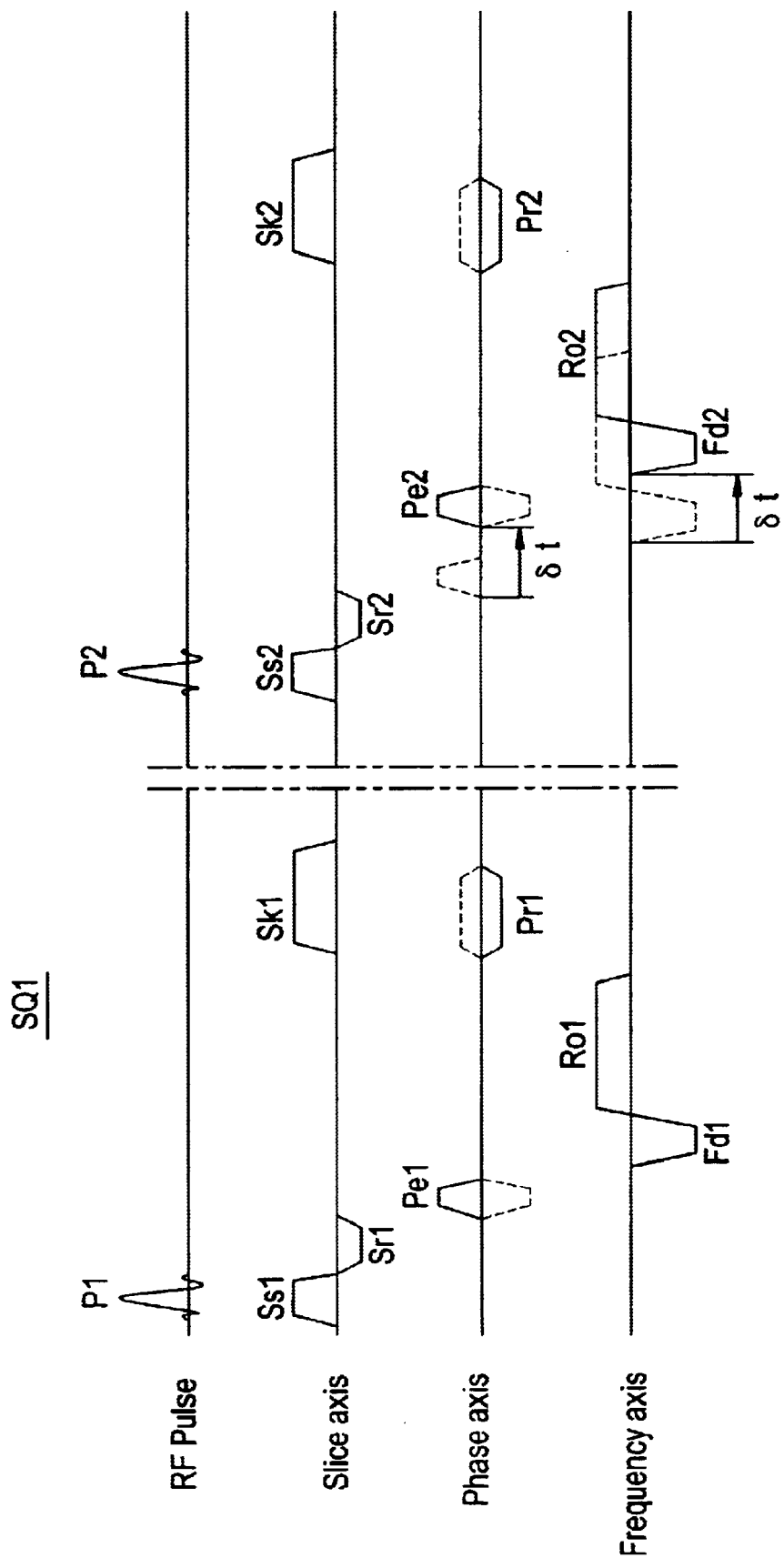
FIG. 2 is a pulse sequence chart of a static magnetic field inhomogeneity distribution measuring sequence in accordance with the first embodiment.

FIG. 2 is a pulse sequence chart showing a static magnetic field inhomogeneity distribution measuring sequence SQ1 in accordance with the first embodiment.

The static magnetic field inhomogeneity distribution measuring sequence SQ1 applies an RF pulse P1 and a slice selective gradient Ss1; subsequently applies a slice rephasing gradient Sr1 having an intensity half or about half of that of the slice selective gradient Ss1; applies a phase encoding gradient Pe1; applies a frequency dephasing gradient Fd1 having an intensity double or about double of that of a readout gradient Ro1; subsequently collects first MR data while applying the readout gradient Ro1; then, applies a phase rewinding gradient Pr1 having an intensity half or about half of that of the phase encoding gradient Pe1; and further applies a killer gradient Sk1 having an intensity equal to that of the slice selective gradient Ss1. Subsequent to the first gradient echo sequence, a second gradient echo sequence in which the echo time is shifted by δt collects second MR data.

Then, the distribution of static magnetic field inhomogeneity is measured based on the phase difference between the first and second MR data. Moreover, shimming is conducted to correct the distribution of static magnetic field inhomogeneity.

Figure 3:
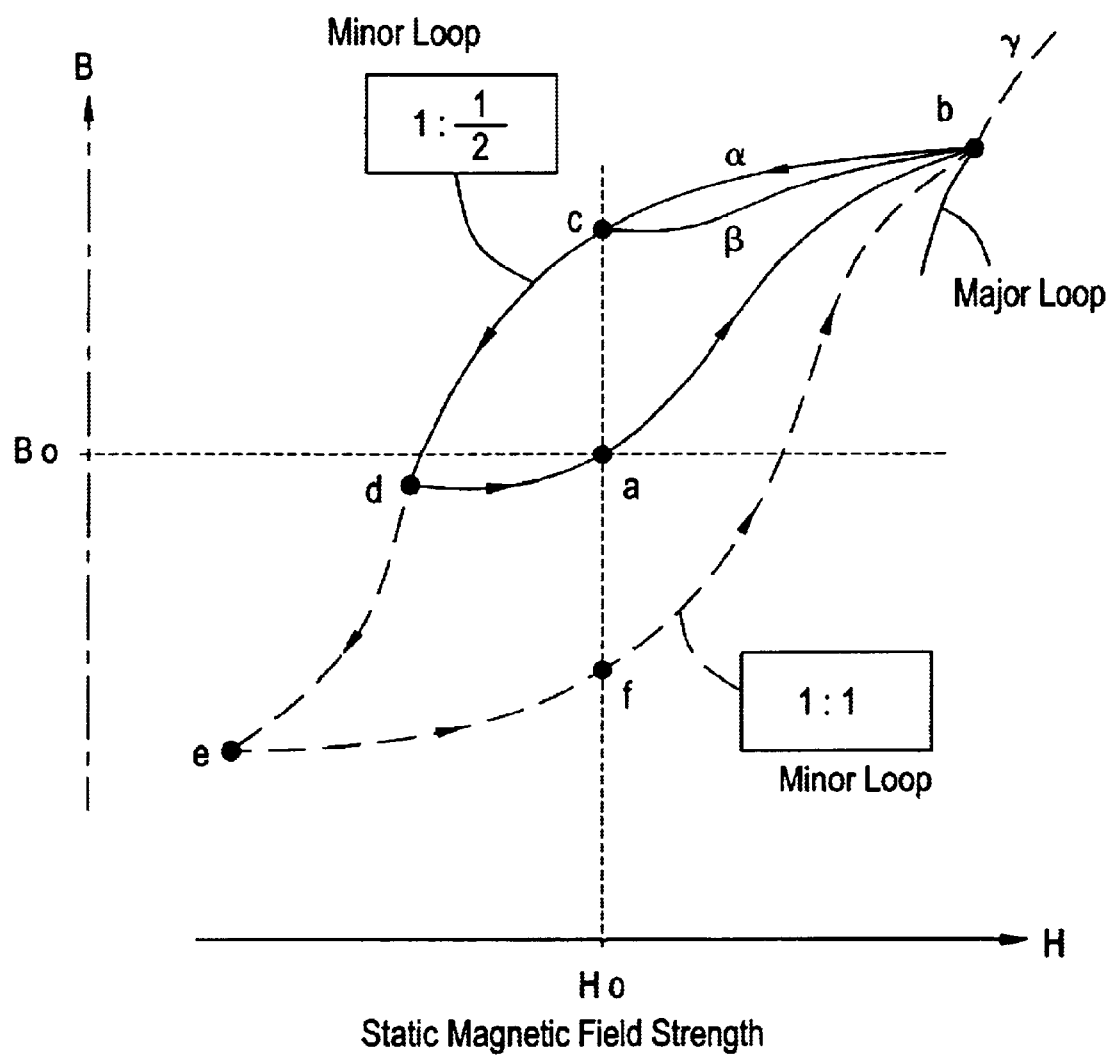
FIG. 3 is a magnetization characteristic graph for explaining residual magnetization caused by gradient pulses in slice and phase axes in the static magnetic field inhomogeneity distribution measuring sequence in accordance with the first embodiment.
Figure 4:
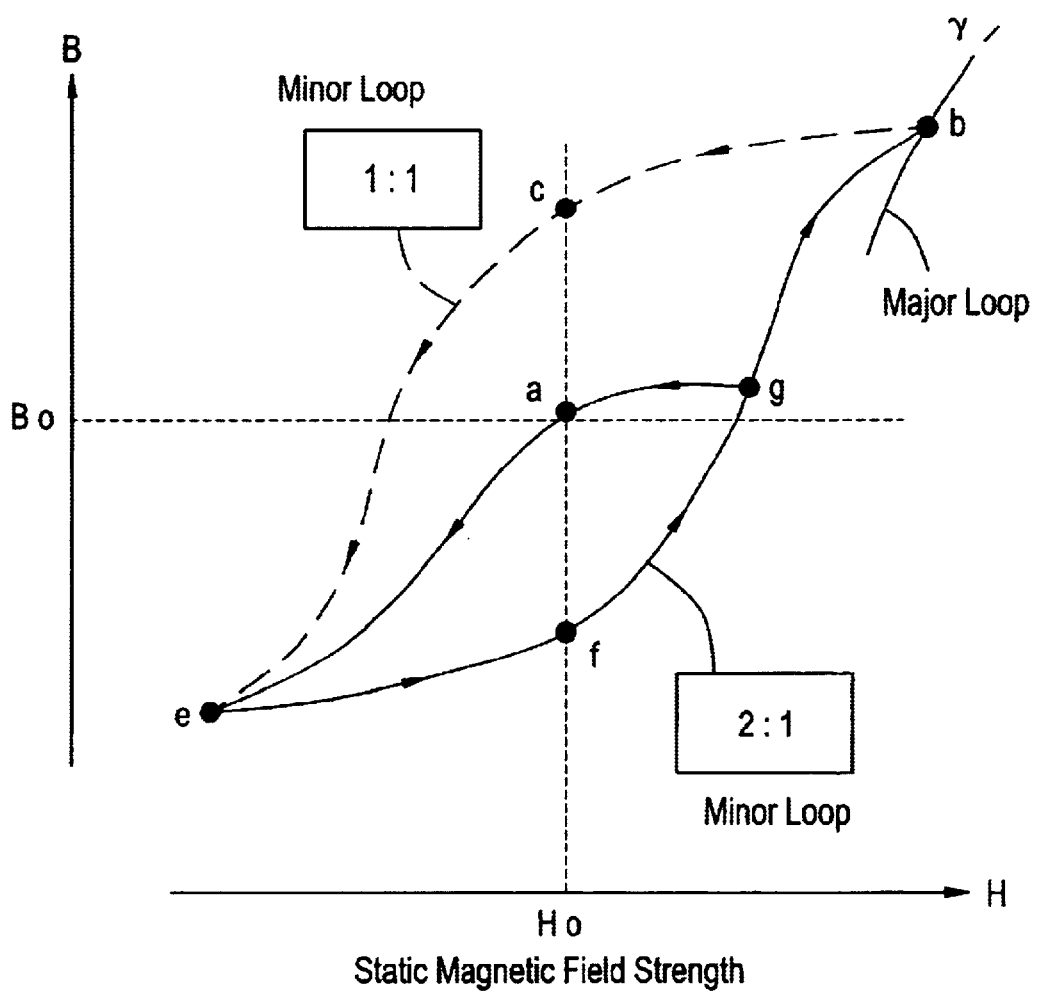
FIG. 4 is a magnetization characteristic graph for explaining residual magnetization caused by gradient pulses in a frequency axis in the static magnetic field inhomogeneity distribution measuring sequence in accordance with the first embodiment.

FIGS. 3 and 4 are magnetization characteristic graphs for explaining residual magnetization caused by the gradient pulses in the static magnetic field inhomogeneity distribution measuring sequence SQ1 shown in FIG. 2. It should be noted that the graphs are presented merely for explanation of a concept, and do not limit the present invention.

Considering first only the effect of the gradient pulses applied to the slice axis in general, when the, magnetization lies at a point a of a magnetization B0 corresponding to a static magnetic field strength H0, application of the slice selective gradient Ss1 and slice rephasing gradient Sr1 by the first gradient echo sequence causes the magnetization to move from the point a, through points b, c and d, to the point a, as shown in FIG. 3. That is, the magnetization returns to the point a of the magnetization B0 corresponding to the static magnetic field strength H0. Then, when the killer gradient Sk1 is applied, the magnetization moves from the point a through the point b to the point c. In the subsequent second gradient echo sequence, when the slice selective gradient Ss2 and slice rephasing gradient Sr2 are applied, the magnetization moves from the point c, through the points b, c and d, to the point a. That is, the magnetization returns to the point a of the magnetization B0 corresponding to the static magnetic field strength H0. Thus, the magnetization is always B0 corresponding to the static magnetic field strength H0 when MR data is collected.

Considering next only the effect of the gradient pulses applied to the phase axis in general, when the magnetization lies at the point a of a magnetization B0 corresponding to a static magnetic field strength H0, application of the phase encoding gradient Pe1 by the first gradient echo sequence causes the magnetization to move from the point a through the point b to the point c, and subsequent application of the phase rewinding gradient Pr1 causes the magnetization to move from the point c through the point d back to the point a, as shown in FIG. 3. Since the time from the phase encoding gradient Pe1 to the MR data collection is short, the effect of residual magnetization at the point c can be ignored. On the other hand, since the time from the phase rewinding gradient Pr1 to the MR data collection in the second gradient echo sequence is long, the effect of residual magnetization therebetween cannot be ignored, but the effect of residual magnetization is eliminated because the magnetization returns to B0 corresponding to the static magnetic field strength H0 after the phase rewinding gradient Pr1.

Next, considering only the effect of the gradient pulses applied to the frequency axis in general, when the magnetization lies at a point a of a magnetization B0 corresponding to a static magnetic field strength H0, as shown in FIG. 4, application of the frequency dephasing gradient Fd1 and readout gradient Ro1 by the first gradient echo sequence causes the magnetization to move from the point a, through points e, f and g, and back to the point a.

As described above, since the static magnetic field inhomogeneity distribution measuring sequence SQ1 of the first embodiment suppresses the effect of residual magnetization by gradient pulses, the distribution of static magnetic field inhomogeneity is highly accurately measured. As a result, correct shimming can be conducted.

—Second Embodiment—

Figure 5:
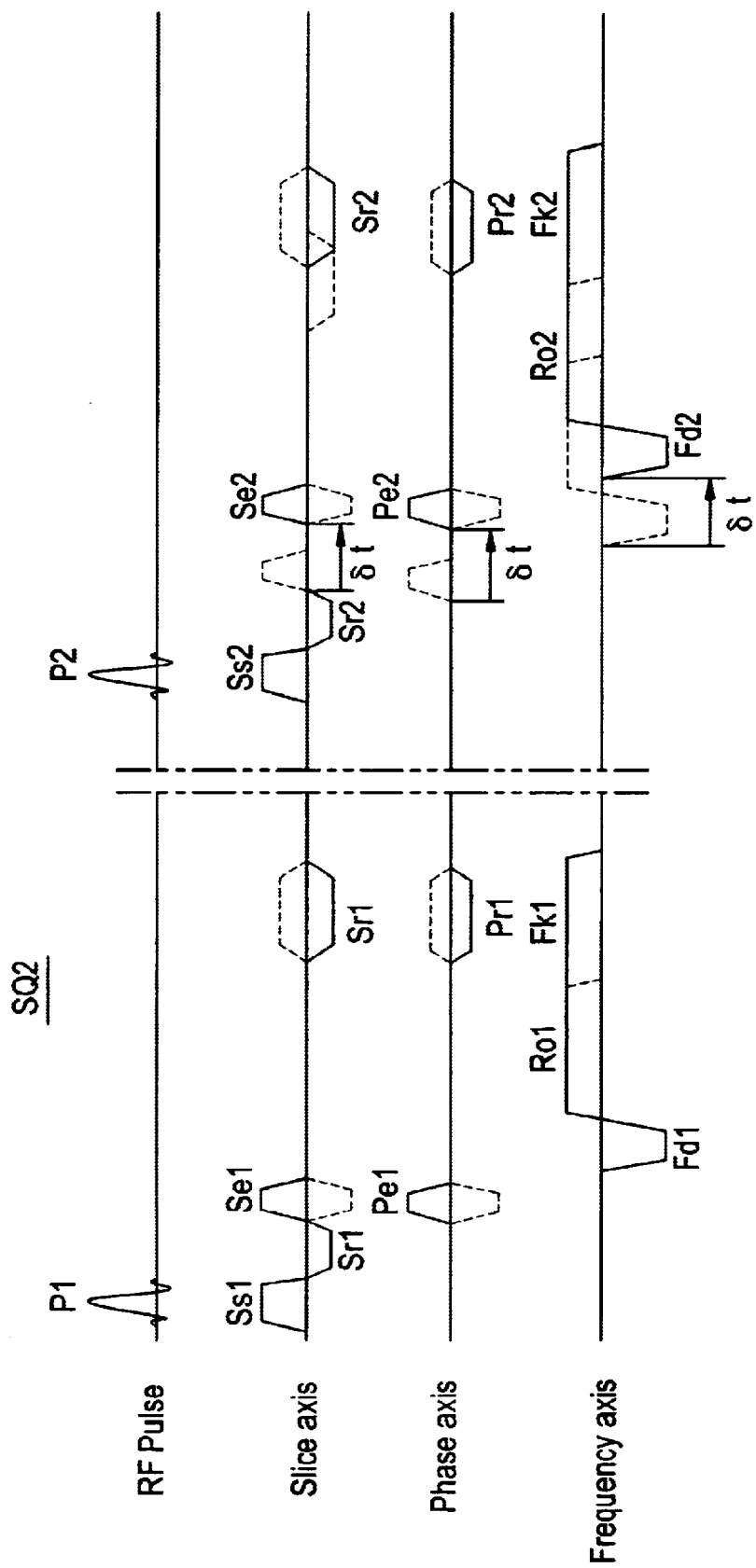
FIG. 5 is a pulse sequence chart of a static magnetic field inhomogeneity distribution measuring sequence in accordance with a second embodiment.

FIG. 5 is a pulse sequence chart showing a static magnetic field inhomogeneity distribution measuring sequence SQ2 in accordance with a second embodiment.

The static magnetic field inhomogeneity distribution measuring sequence SQ2 applies an RF pulse P1 and a slice selective gradient Ss1; subsequently applies a slice rephasing gradient Sr1 having an intensity half or about half of that of the slice selective gradient Ss1; applies a slice encoding gradient Se1; applies a phase encoding gradient Pe1; applies a frequency dephasing gradient Fd1 having an intensity double or about double of that of a readout gradient Ro1; subsequently collects first MR data while applying the readout gradient Ro1; then, applies a slice rewinding gradient Sr1 having an intensity half or about half of the slice encoding gradient Se1; applies a phase rewinding gradient Pr1 having an intensity half or about half of that of the phase encoding gradient Pe1; and further applies a killer gradient Fk1 to the frequency axis having an intensity equal to that of the readout gradient Ro1 subsequent to the readout gradient Ro1. Subsequent to the first gradient echo sequence, a second gradient echo sequence in which the echo time is shifted by δt collects second MR data.

Then, the distribution of static magnetic field inhomogeneity is measured based on the phase difference between the first and second MR data. Moreover, shimming is conducted to correct the distribution of static magnetic field inhomogeneity.

Considering now only the effect of the gradient pulses applied to the slice axis in general, when the magnetization lies at a point a of a magnetization B0 corresponding to a static magnetic field strength H0, application of the slice selective gradient Ss1 and slice rephasing gradient Sr1 by the first gradient echo sequence causes the magnetization to move from the point a, through points b, c and d, to the point a, as shown in FIG. 3. That is, the magnetization returns to the point a of the magnetization B0 corresponding to the static magnetic field strength H0. Then, when the slice encoding gradient Se1 (assuming that it has an intensity equal to the slice selective gradient Ss1) is applied, the magnetization moves from the point a through the point b to the point c; and when the slice rewinding gradient Sr1 is next applied, the magnetization moves from the point c through the point d back to the point a. Since the time from the slice encoding gradient Se1 to the MR data collection is short, the effect of residual magnetization at the point c can be ignored. On the other hand, since the time from the slice rewinding gradient Sr1 to the MR data collection in the second gradient echo sequence is long, the effect of residual magnetization therebetween cannot be ignored, but the effect of residual magnetization is eliminated because the magnetization returns to B0 corresponding to the static magnetic field strength H0 after the slice rewinding gradient Sr1.

Considering next only the effect of the gradient pulses applied to the phase axis in general, when the magnetization lies at the point a of a magnetization B0 corresponding to a static magnetic field strength H0, application of the phase encoding gradient Pe1 by the first gradient echo sequence causes the magnetization to move from the point a through a point b to the point c, and subsequent application of the phase rewinding gradient Pr1 causes the magnetization to move from the point c through the point d back to the point a, as shown in FIG. 3. Since the time from the phase encoding gradient Pe1 to the MR data collection is short, the effect of residual magnetization at the point c can be ignored. On the other hand, since the time from the phase rewinding gradient Pr1 to the MR data collection in the second gradient echo sequence is long, the effect of residual magnetization therebetween cannot be ignored, but the effect of residual magnetization is eliminated because the magnetization returns to B0 corresponding to the static magnetic field strength H0 after the phase rewinding gradient Pr1.

Next, considering only the effect of the gradient pulses applied to the frequency axis in general, when the magnetization lies at a point a of a magnetization B0 corresponding to a static magnetic field strength H0, as shown in FIG. 4, application of the frequency dephasing gradient Fd1, readout gradient Ro1, and killer gradient Fk1 by the first gradient echo sequence causes the magnetization to move from the point a, through points e, f and g, and back to the point a. That is, the effect of residual magnetization is eliminated because the magnetization returns to B0 corresponding to the static magnetic field strength H0.

As described above, since the static magnetic field inhomogeneity distribution measuring sequence SQ2 of the second embodiment suppresses the effect of residual magnetization by gradient pulses also in 3D imaging, the distribution of static magnetic field inhomogeneity is highly accurately measured. As a result, correct shimming can be conducted.

—Third Embodiment—

Figure 6:
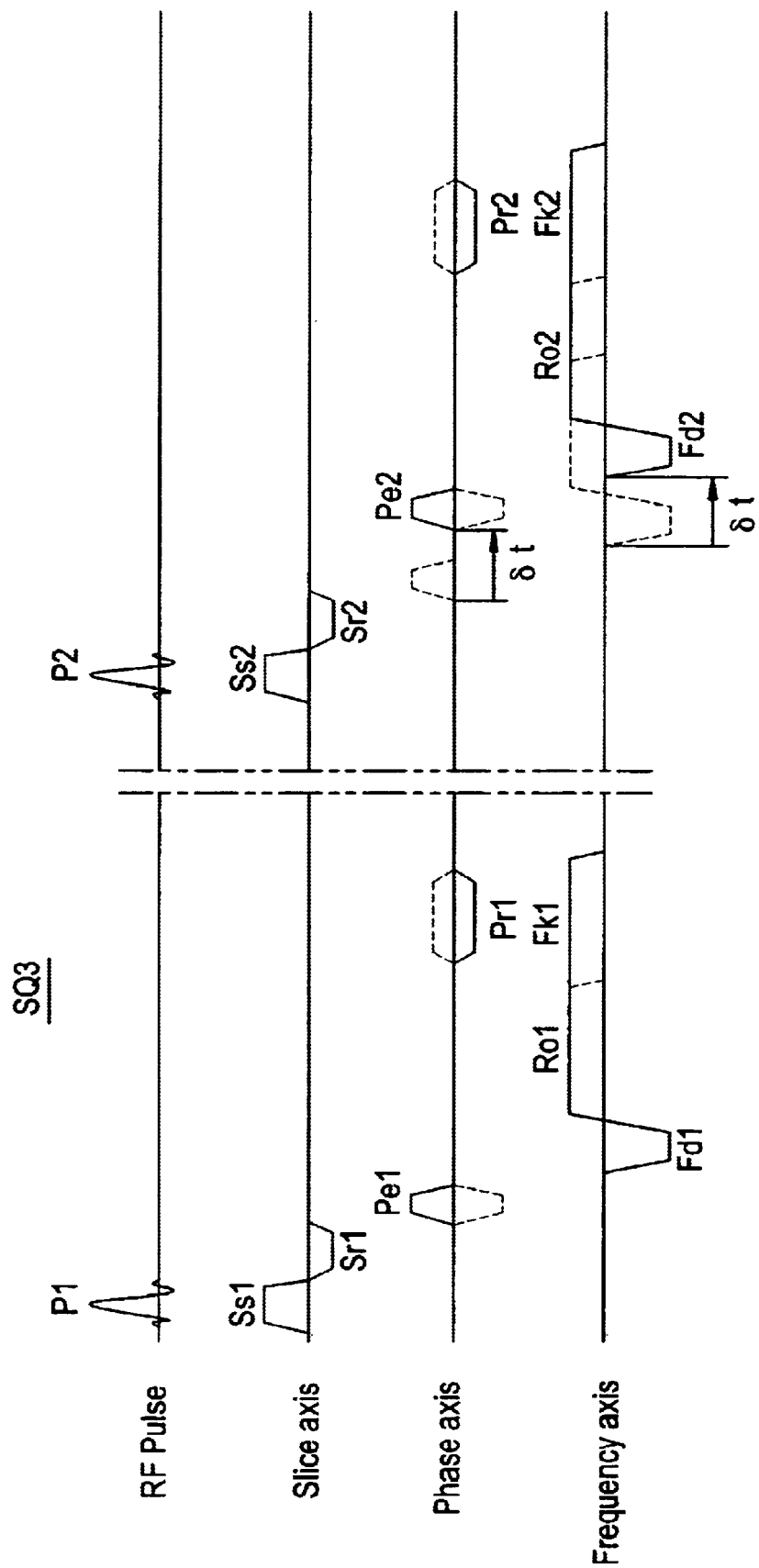
FIG. 6 a pulse sequence chart of a static magnetic field inhomogeneity distribution measuring sequence in accordance with a third embodiment.
Figure 7:
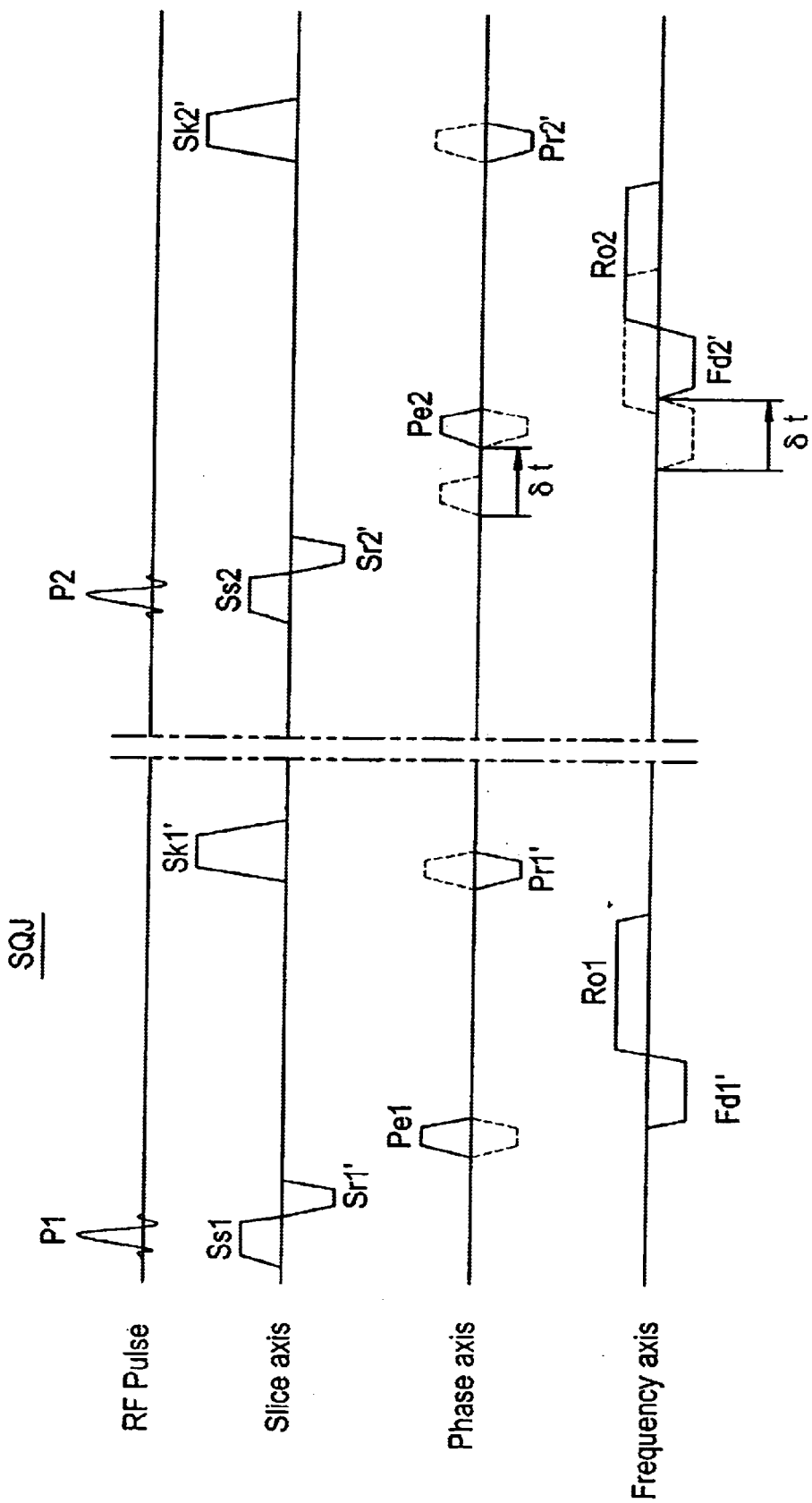
FIG. 7 is a pulse sequence chart of a conventional static magnetic field inhomogeneity distribution measuring sequence.
Figure 8:
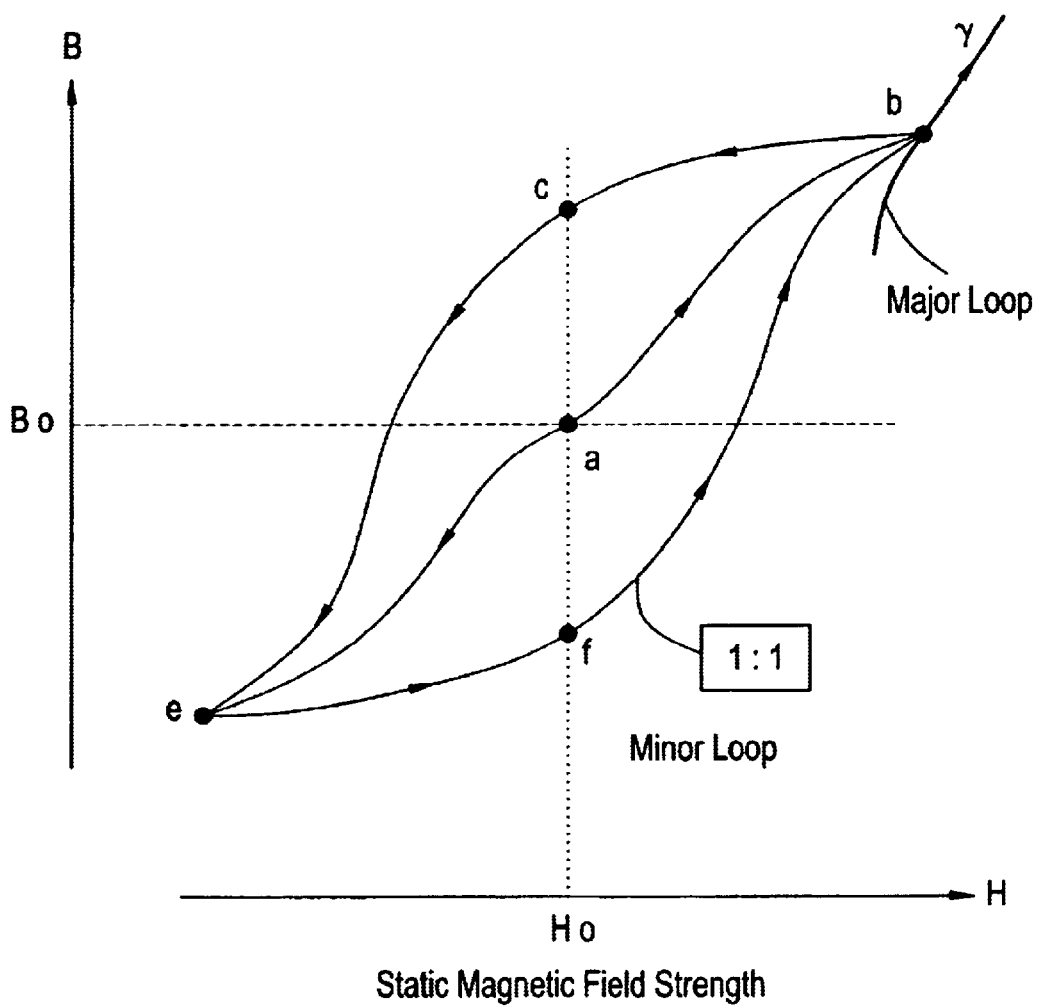
FIG. 8 is a magnetization characteristic graph for explaining residual magnetization caused by gradient pulses in the conventional static magnetic field inhomogeneity distribution measuring sequence.

FIG. 6 is a pulse sequence chart showing a static magnetic field inhomogeneity distribution measuring sequence SQ3 in accordance with a third embodiment.

The static magnetic field inhomogeneity distribution measuring sequence SQ3 applies an RF pulse P1 and a slice selective gradient Ss1; subsequently applies a slice rephasing gradient Sr1 having an intensity half or about half of that of the slice selective gradient Ss1; applies a phase encoding gradient Pe1; applies a frequency dephasing gradient Fd1 having an intensity double or about double of that of a readout gradient Ro1; subsequently collects first MR data while applying the readout gradient Ro1; then, applies a phase rewinding gradient Pr1 having an intensity half or about half of that of the phase encoding gradient Pe1; and further applies a killer gradient Fk1 to the frequency axis having an intensity equal to that of the readout gradient Ro1 subsequent to the readout gradient Ro1. Subsequent to the first gradient echo sequence, a second gradient echo sequence in which the echo time is shifted by δt collects second MR data.

Then, the distribution of static magnetic field inhomogeneity is measured based on the phase difference between the first and second MR data. Moreover, shimming is conducted to correct the distribution of static magnetic field inhomogeneity.

Considering now only the effect of the gradient pulses applied to the slice axis in general, when the magnetization lies at a point a of a magnetization B0 corresponding to a static magnetic field strength H0, as shown in FIG. 3, application of the slice selective gradient Ss1 and slice rephasing gradient Sr1 by the first gradient echo sequence causes the magnetization to move from the point a, through points b, c and d, to the point a. That is, the magnetization returns to the point a of the magnetization B0 corresponding to the static magnetic field strength H0. Thus, the effect of residual magnetization is eliminated because the magnetization returns to B0 corresponding to the static magnetic field strength H0.

Considering next only the effect of the gradient pulses applied to the phase axis in general, when the magnetization lies at the point a of a magnetization B0 corresponding to a static magnetic field strength H0, application of the phase encoding gradient Pe1 by the first gradient echo sequence causes the magnetization to move from the point a through the point b to the point c, and subsequent application of the phase rewinding gradient Pr1 causes the magnetization to move from the point c through the point d back to the point a, as shown in FIG. 3. Since the time from the phase encoding gradient Pe1 to the MR data collection is short, the effect of residual magnetization at the point c can be ignored. On the other hand, since the time from the phase rewinding gradient Pr1 to the MR data collection in the second gradient echo sequence is long, the effect of residual magnetization therebetween cannot be ignored, but the effect of residual magnetization is eliminated because the magnetization returns to B0 corresponding to the static magnetic field strength H0 after the phase rewinding gradient Pr1.

Next, considering only the effect of the gradient pulses applied to the frequency axis in general, when the magnetization lies at a point a of a magnetization B0 corresponding to a static magnetic field strength H0, as shown in FIG. 4, application of the frequency dephasing gradient Fd1, readout gradient Ro1, and killer gradient Fk1 by the first gradient echo sequence causes the magnetization to move from the point a, through points e, f and g, and back to the point a. That is, the effect of residual magnetization is eliminated because the magnetization returns to B0 corresponding to the static magnetic field strength H0.

As described above, since the static magnetic field inhomogeneity distribution measuring sequence SQ3 of the third embodiment suppresses the effect of residual magnetization by gradient pulses, the distribution of static magnetic field inhomogeneity is highly accurately measured. As a result, correct shimming can be conducted.

—Other Embodiments—

Although the present invention was applied to a static magnetic field inhomogeneity distribution measuring method in the preceding description, the present invention may generally be applied to pulse sequences for acquiring MR data. Specifically, by applying at least one of the following, the effect of residual magnetization by gradient pulses can be suppressed:

(1) making the strength of the phase rewinding gradient half or about half of that of the phase encoding gradient;

(2) making the strength of the slice rewinding gradient half or about half of that of the slice encoding gradient;

(3) applying a killer gradient having an intensity equal to that of the slice selective gradient to the slice axis; and (4) applying a killer gradient having an intensity equal to that of the readout gradient to the frequency axis subsequent to the readout gradient.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus comprising:

RF pulse transmitting means;

gradient pulse applying means;

MR signal receiving means;

first MR data collecting means for, by controlling the aforesaid means, collecting first MR data from an echo focused by a first gradient echo sequence in which the intensity of a killer gradient applied to a slice axis is made equal to that of a slice selective gradient, the intensity of a slice rephasing gradient is made half or about half of that of the slice selective gradient, the intensity of a phase rewinding gradient is made half or about half of that of a phase encoding gradient, and the intensity of a frequency dephasing gradient is made double or about double of that of a readout gradient; and second MR data collecting means for collecting second MR data from an echo focused by a second gradient echo sequence in which the echo time is shifted by $\delta t$ relative to said first gradient echo sequence.

2. The MRI apparatus of claim 1, further comprising: static magnetic field inhomogeneity distribution measuring means for measuring the distribution of static magnetic field inhomogeneity based on the phase difference between said first and second MR data.

3. An MRI apparatus comprising:

RF pulse transmitting means;

gradient pulse applying means;

MR signal receiving means;

first MR data collecting means for, by controlling the aforesaid means, collecting first MR data from an echo focused by a first gradient echo sequence in which the intensity of a slice rephasing gradient is made half or about half of that of a slice selective gradient, the intensity of a slice rewinding gradient is made half or about half of that of a slice encoding gradient, the intensity of a phase rewinding gradient is made half or about half of that of a phase encoding gradient, the intensity of a frequency dephasing gradient is made double or about double of that of a readout gradient, and the intensity of a killer gradient applied to a frequency axis is made equal to that of the readout gradient and the killer gradient is applied subsequent to the readout gradient; and second MR data collecting means for collecting second MR data from an echo focused by a second gradient echo sequence in which the echo time is shifted by $\delta t$ relative to said first gradient echo sequence.

4. The MRI apparatus of claim 3, further comprising: static magnetic field inhomogeneity distribution measuring means for measuring the distribution of static magnetic field inhomogeneity based on the phase difference between said first and second MR data.

5. An MRI apparatus comprising:

RF pulse transmitting means;

gradient pulse applying means;

MR signal receiving means;

first MR data collecting means for, by controlling the aforesaid means, collecting first MR data from an echo focused by a first gradient echo sequence in which the intensity of a slice rephasing gradient is made half or about half of that of a slice selective gradient, the intensity of a phase rewinding gradient is made half or about half of that of a phase encoding gradient, the intensity of a frequency dephasing gradient is made double or about double of that of a readout gradient, and the intensity of a killer gradient applied to a frequency axis is made equal to that of the readout gradient and the killer gradient is applied subsequent to the readout gradient; and, second MR data collecting means for collecting second MR data from an echo focused by a second gradient echo sequence in which the echo time is shifted by $\delta t$ relative to said first gradient echo sequence.

6. The MRI apparatus of claim 5, further comprising: static magnetic field inhomogeneity distribution measuring means for measuring the distribution of static magnetic field inhomogeneity based on the phase difference between said first and second MR data.

* * * * *